(12) United States Patent
Yeon et al.

(10) Patent No.: US 12,471,313 B2
(45) Date of Patent: Nov. 11, 2025

(54) ARRAY SUBSTRATE AND DISPLAY DEVICE INCLUDING THEREOF

(71) Applicant: LG Display Co., Ltd., Seoul (KR)

(72) Inventors: Deuk-Ho Yeon, Paju-si (KR); Kum-Mi Oh, Paju-si (KR); Sun-Wook Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 546 days.

(21) Appl. No.: 17/977,978

(22) Filed: Oct. 31, 2022

(65) Prior Publication Data

US 2023/0155030 A1     May 18, 2023

(30) Foreign Application Priority Data

Nov. 12, 2021    (KR) ........................ 10-2021-0155320

(51) Int. Cl.
    *H10D 30/67*         (2025.01)
    *H10H 29/14*         (2025.01)
              (Continued)

(52) U.S. Cl.
    CPC ..... *H10D 30/6723* (2025.01); *H10D 30/6731* (2025.01); *H10D 30/6745* (2025.01);
              (Continued)

(58) Field of Classification Search
    CPC .. H10K 59/126; H10K 59/8794; H10D 86/60; H10D 30/6723; H10D 30/031; H10D 86/40; H10D 86/021; H10D 86/0212; H10D 30/67; H10D 30/6733; H01L 25/167; G02F 1/136209; G02F 1/136218
See application file for complete search history.

(56) References Cited

U.S. PATENT DOCUMENTS 5,605,847 A *   2/1997   Zhang ............... G02F 1/136209
                                                               438/164
7,723,842 B2 *   5/2010   Tsurume ............. H01L 23/3735
                                                            257/E23.101

(Continued)

FOREIGN PATENT DOCUMENTS

| KR | 2002-0058426 A | 7/2002 |
|---|---|---|
| KR | 20170003796 A | 1/2017 |
| KR | 10-2219343 B1 | 2/2021 |

*Primary Examiner* — Maliheh Malek
(74) *Attorney, Agent, or Firm* — Seed Intellectual Property Law Group LLP

(57) ABSTRACT

The present disclosure discloses an array substrate and a display device including thereof. The array substrate includes a substrate, a shield metal over the substrate and a thin film transistor including an active layer with a channel region over the shield metal and a thermal gradient portion in at least one of the shield metal, the active layer and the array substrate so as to lower a temperature of a first area of the channel region than a temperature of a second area of the channel region. A cooling zone between the channel region and the shield metal is defined by the thermal gradient portion. The array substrate and a display device including the array substrate including the thermal gradient portion that defines the cooling zone between the thin film transistor and the shield metal can improves Kink effect, maintain high driving voltage, increase on current and/or improve switching properties.

23 Claims, 11 Drawing Sheets

(51) Int. Cl.
*H10K 59/126* (2023.01)
*H10K 59/80* (2023.01)

(52) U.S. Cl.
CPC ......... *H10H 29/142* (2025.01); *H10K 59/126* (2023.02); *H10K 59/8794* (2023.02)

(56) References Cited

U.S. PATENT DOCUMENTS

| | | | | |
|---|---|---|---|---|
| 7,859,189 | B2* | 12/2010 | Young | H10K 59/60 313/506 |
| 9,171,891 | B2* | 10/2015 | Xiong | H10K 59/8794 |
| 9,934,723 | B2* | 4/2018 | Lee | G09G 3/3233 |
| 11,050,394 | B2* | 6/2021 | DuBose | H05K 7/20509 |
| 11,658,167 | B2* | 5/2023 | He | H10D 86/60 257/71 |
| 11,894,283 | B2* | 2/2024 | Liu | H10K 59/126 |
| 12,224,354 | B2* | 2/2025 | Ding | H10D 86/423 |
| 2005/0077601 | A1* | 4/2005 | Yu | H10K 50/87 257/E23.104 |
| 2005/0077615 | A1* | 4/2005 | Yu | H10K 71/00 257/E23.102 |
| 2006/0110847 | A1* | 5/2006 | Fujimori | H10K 71/12 438/82 |
| 2006/0226773 | A1* | 10/2006 | Kim | H10K 59/173 313/512 |
| 2007/0296333 | A1* | 12/2007 | Kim | H10K 59/126 313/506 |
| 2010/0002178 | A1* | 1/2010 | Ninomiya | G02F 1/136259 349/138 |
| 2010/0065851 | A1* | 3/2010 | Makita | H10D 86/00 438/164 |
| 2010/0171131 | A1* | 7/2010 | Iki | H10D 86/481 257/91 |
| 2012/0313092 | A1* | 12/2012 | Shieh | H10D 99/00 257/E29.296 |
| 2013/0162938 | A1* | 6/2013 | Zhou | H10D 86/60 257/E29.082 |
| 2013/0181332 | A1* | 7/2013 | Kelkar | H01L 23/3107 257/E23.051 |
| 2013/0300968 | A1* | 11/2013 | Okajima | G02F 1/136286 257/66 |
| 2015/0279859 | A1* | 10/2015 | Chen | H10D 86/441 438/151 |
| 2015/0379923 | A1* | 12/2015 | Lee | H10K 59/1315 345/82 |
| 2016/0043159 | A1* | 2/2016 | Kim | H10K 59/1216 257/71 |
| 2016/0056297 | A1* | 2/2016 | Yu | H10D 30/031 257/43 |
| 2016/0163780 | A1* | 6/2016 | Park | H10K 59/123 257/40 |
| 2016/0260750 | A1* | 9/2016 | Ueda | H10D 62/80 |
| 2016/0289065 | A1* | 10/2016 | DeBar | B81C 1/00833 |
| 2017/0194411 | A1* | 7/2017 | Park | H10K 59/873 |
| 2017/0250207 | A1* | 8/2017 | Wang | H10D 30/6745 |
| 2018/0033849 | A1* | 2/2018 | Noh | H10D 86/471 |
| 2018/0053834 | A1* | 2/2018 | Zhang | H10D 86/425 |
| 2018/0212010 | A1* | 7/2018 | Jiang | H01L 21/26513 |
| 2019/0013411 | A1* | 1/2019 | Lee | H10D 86/441 |
| 2019/0221429 | A1* | 7/2019 | Tian | H01L 21/266 |
| 2019/0326271 | A1* | 10/2019 | Chi | H10K 59/873 |
| 2019/0386031 | A1* | 12/2019 | Chen | H10D 30/0314 |
| 2020/0091253 | A1* | 3/2020 | Liu | H10K 59/1213 |
| 2020/0203382 | A1* | 6/2020 | Jung | G09G 3/3266 |
| 2020/0271526 | A1* | 8/2020 | Tepegoz | G01J 5/0806 |
| 2020/0286929 | A1* | 9/2020 | Li | H10D 86/60 |
| 2021/0184050 | A1* | 6/2021 | Li | H01L 21/02595 |
| 2021/0325740 | A1* | 10/2021 | Xian | G02F 1/136286 |
| 2021/0336085 | A1* | 10/2021 | Yoon | H10H 20/018 |
| 2021/0376029 | A1* | 12/2021 | Yuan | H10D 30/6729 |
| 2021/0398876 | A1* | 12/2021 | Liu | H10K 59/126 |
| 2022/0093890 | A1* | 3/2022 | Park | H05K 7/20963 |
| 2022/0109041 | A1* | 4/2022 | Lee | H10K 59/8731 |
| 2022/0113824 | A1* | 4/2022 | Kishimoto | H10K 77/111 |
| 2022/0157693 | A1* | 5/2022 | Zhou | H01L 25/50 |
| 2022/0199835 | A1* | 6/2022 | Noh | H10D 86/423 |
| 2022/0246594 | A1* | 8/2022 | Shimizu | H05B 33/14 |
| 2022/0344432 | A1* | 10/2022 | Shi | H10K 59/121 |
| 2022/0373584 | A1* | 11/2022 | Lin | G01R 31/2628 |
| 2022/0399413 | A1* | 12/2022 | Yang | H10K 50/84 |
| 2022/0399511 | A1* | 12/2022 | Bok | B32B 27/06 |
| 2023/0088235 | A1* | 3/2023 | Luo | H10K 59/38 257/40 |
| 2023/0131235 | A1* | 4/2023 | Zhang | H10D 30/6734 257/40 |
| 2023/0369167 | A1* | 11/2023 | Chen | H01L 24/24 |
| 2023/0380217 | A1* | 11/2023 | Lu | H10K 59/1216 |
| 2023/0395748 | A1* | 12/2023 | Bang | H10H 20/831 |
| 2024/0074258 | A1* | 2/2024 | Kim | H10K 77/10 |
| 2024/0188411 | A1* | 6/2024 | Jia | H10K 71/135 |
| 2024/0215313 | A1* | 6/2024 | Ma | H10K 59/1213 |
| 2024/0215317 | A1* | 6/2024 | Yang | H10K 59/1201 |
| 2024/0215330 | A1* | 6/2024 | Cheng | H10K 59/00 |
| 2024/0243180 | A1* | 7/2024 | Yang | H10D 64/027 |
| 2024/0428838 | A1* | 12/2024 | Yoo | G11C 11/54 |
| 2025/0160167 | A1* | 5/2025 | Kim | H10K 59/90 |
| 2025/0160171 | A1* | 5/2025 | Kim | H10K 77/111 |
| 2025/0194390 | A1* | 6/2025 | Shin | G06F 1/1652 |

* cited by examiner

ARRAY SUBSTRATE AND DISPLAY DEVICE INCLUDING THEREOF

CROSS-REFERENCE TO RELATED APPLICATION(S)

This application claims the priority benefit of Korean Patent Application No. 10-2021-0155320, filed in the Republic of Korea on Nov. 12, 2021, the entire contents of which are expressly incorporated herein by reference in its entirety into the present application.

BACKGROUND

Technical Field

The present disclosure relates to an array substrate, and more specifically, to an array substrate that can generate high driving current and a display device including thereof.

Description of the Related Art

As information technology has progressed, various display devices have been developed. Among the display devices, display devices with self-lighting elements in a display panel without a backlight unit formed outside of the display panel have attracted spotlights. The display device with the self-lighting elements in the display panel includes an array substrate with thin film transistors which define a plurality of pixel regions in display areas and each of which corresponds to each sub-pixel region among the plural pixel regions.

As an example, the array substrate includes a driving thin film transistor supplying driving current with an electroluminescence (EL) diode at each sub-pixel region and a switching thin film transistor supplying gate signal with the driving thin film transistor. The thin film transistor controlling each sub-pixel region should respond rapidly so that the display device should realize rapid image conversions.

Particularly, in case of the display devices with the self-emitting elements such as organic or inorganic light-emitting diode, the thin film transistor should be driven at high current so as to realize excellent luminous properties (e.g., high luminance and/or uniform luminance, etc.).

BRIEF SUMMARY

The inventors have realized that high-current driving causes the thin film transistor to be deteriorated and to lower reliability of the thin film transistor. Since the high-speed driving and reliability of the thin film transistor are in a trade-off relationship with the lifespan of the thin film transistor, it is difficult to improve the reliability, lifespan and driving speed of the thin film transistor simultaneously beyond a threshold.

Accordingly, embodiments of the present disclosure are directed to an array substrate and a display device that substantially obviate one or more of the problems due to the limitations and disadvantages of the related art.

An aspect of the present disclosure is to provide an array substrate with a thin film transistor that can be driven at high current and a display device including the array substrate.

Another aspect of the present disclosure is to provide an array substrate with a thin film transistor with improved reliability and lifespan and a display device including the array substrate.

Additional features and aspects will be set forth in the description that follows, and in part will be apparent from the description, or can be learned by practice of the embodiments provided herein. Other features and technical benefits aspects of the embodiments can be realized and attained by the structure particularly pointed out in the written description, or derivable therefrom, and the claims hereof as well as the appended drawings.

To achieve these and other aspects of the embodiments, as broadly described, the present disclosure provides an array substrate that includes a substrate; a shield metal disposed over the substrate; and a thin film transistor disposed over the shield metal, wherein the thin film transistor includes an active layer over the shield metal, a source electrode, a drain electrode and a gate electrode, wherein the active layer includes a channel region, a source region positioned at one side of the channel region and a drain region positioned at an opposite side of the channel region, and wherein at least one of the shield metal, the channel region and the array substrate includes a thermal gradient portion that causes a temperature of a first area in the channel region to be different from a temperature of a second area in the channel region.

The thermal gradient portion may make a temperature of a central area in the channel region lower than a temperature of a peripheral area in the channel region.

As an example, a width of the thermal gradient portion may be narrower than a width of the channel region.

In one aspect, the thermal gradient portion may include a protrusion formed on at least one of the shield metal and the channel region, and wherein the protrusion protrudes toward the channel region or the shield metal.

In one aspect, the shield metal may include the protrusion directed to the channel region.

The protrusion of the shield metal may be position closer to the drain region than the source region.

Alternatively, the channel region may include the protrusion directed to the shield metal.

The protrusion of the channel region may be positioned closer to the drain region than the source region.

In another aspect, the thermal gradient portion may include a heat cover disposed on a peripheral area on the channel region.

In another aspect, the present disclosure provides an array substrate that includes a plurality of thin film transistors corresponding to a plurality of sub-pixels; and a shield metal disposed under each of the plurality of thin film transistor, wherein each of the plurality of thin film transistors includes an active layer including a channel region, a source region positioned at one side of the channel region and a drain region positioned at an opposite side of the channel region; a gate insulating layer covering the channel region; a gate electrode on the gate insulating layer; an interlayer insulating layer covering the active layer, the gate insulating layer and the gate electrode; a source electrode disposed on the interlayer insulating layer and connected to the source region; and a drain electrode disposed on the interlayer insulating layer and connected to the drain region, and wherein at least one of the shield metal, the channel region and the array substrate includes a thermal gradient portion that causes a temperature of a first area in the channel region to be different from a temperature of a second area in the channel region.

In another aspect, the present disclosure provides an array substrate including: a substrate; a shield metal disposed over the substrate; and a thin film transistor disposed over the shield metal, wherein the thin film transistor includes an active layer over the shield metal, a source electrode, a drain electrode and a gate electrode, wherein the active layer includes a channel region, a source region positioned at one side of the channel region and a drain region positioned at an opposite side of the channel region, and wherein the shield metal or the channel region is provided with a thermal gradient portion that causes a temperature of a first area in the channel region to be different from a temperature of a second area in the channel region.

The shield metal may be provided with a protrusion directed toward the channel region as the thermal gradient portion.

The channel region may be provided with a protrusion directed to the shield metal as the thermal gradient portion.

The channel region may be provided with a heat cover on a peripheral area on the channel region as the thermal gradient portion.

The first area may be an area corresponding to the thermal gradient portion in the channel region, and the second area may be an area in the channel region other than the first area.

In still another aspect, the present disclosure provides a display device that includes an array substrate including a substrate, a shield metal disposed over the substrate and a thin film transistor disposed over the shield metal; and an electro-luminescence element electrically connected to the thin film transistor, wherein the thin film transistor includes an active layer over the shield metal, a source electrode, a drain electrode and a gate electrode, wherein the active layer includes a channel region, a source region positioned at one side of the channel region and a drain region positioned at an opposite side of the channel region, and wherein at least one of the shield metal, the channel region and the array substrate includes a thermal gradient portion that makes a temperature of a first area in the channel region different from a temperature of a second area in the channel region.

It is to be understood that both the foregoing general description and the following detailed description are examples and explanatory and are intended to provide further explanation of the embodiments as claimed.

BRIEF DESCRIPTION OF THE SEVERAL VIEWS OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference will now be made in detail to aspects of the disclosure, examples of which are illustrated in the accompanying drawings.

Figure 1:
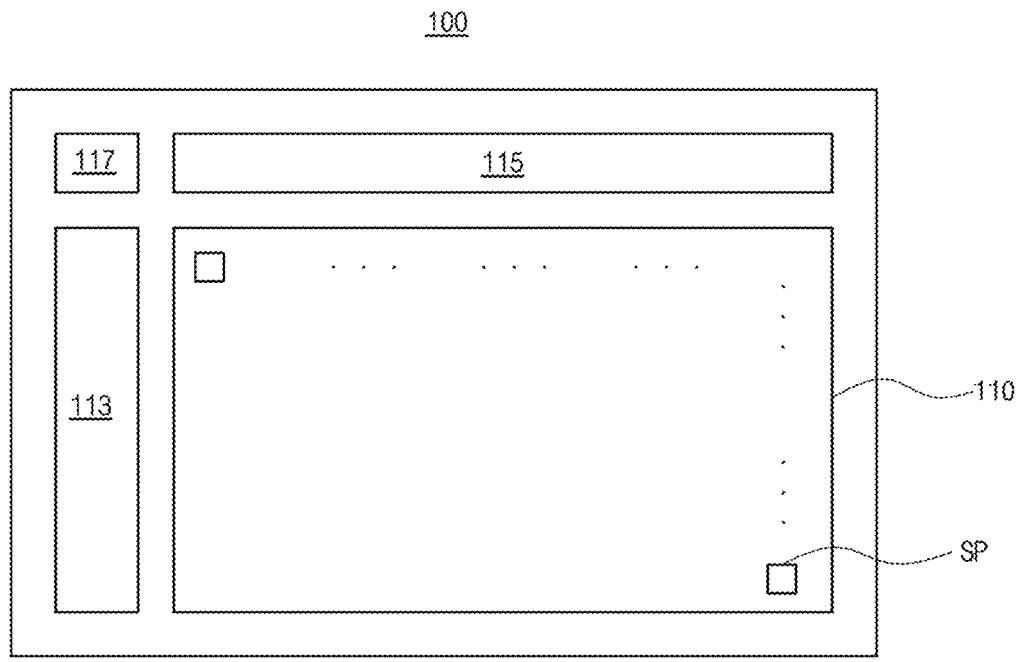
FIG. 1 is a schematic plain view illustrating a display device in accordance with an aspect of the present disclosure.
Figure 2:
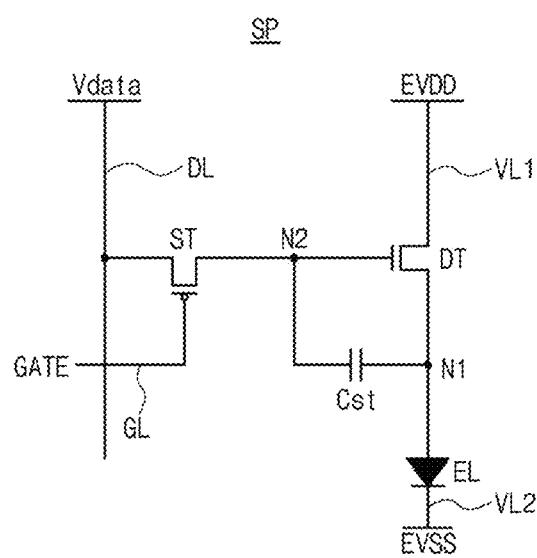
FIG. 2 is a schematic circuit diagram illustrating a sub-pixel illustrated in FIG. 1.

FIG. 1 is a schematic plain view illustrating a display device in accordance with an aspect of the present disclosure and FIG. 2 is a schematic circuit diagram illustrating a sub-pixel illustrated in FIG. 1.

As illustrated in FIGS. 1 and 2, a display device 100 in accordance with the present disclosure may include a pixel array 110, a gate drive circuit 113, a data drive circuit 115 and a control circuit 117 and the likes for driving the pixel array 110.

A plurality of gate lines GL and a plurality of data lines DL are arranged in the pixel array 110, and a plurality of sub-pixels SP are arranged at a region where the plural gate lines GL and the plural data lines DL. In addition, first and second power lines VL1 and VL2 where voltages and signals for driving the sub-pixel SP are applied can be arranged in each sub-pixel SP. In addition, an electro-luminescene (EL) element such as an organic light-emitting diode (OLED), a quantum light-emitting diode (QLED), a micro light-emitting diode (micro-LED or μLED) and nano light-emitting diode (nano-LED) for displaying images and a thin film transistor DT or ST for driving the electro-luminescence element may further arranged in each sub-pixel SP.

The gate drive circuit 113 controlled by the control circuit 117 provides sequentially gate voltage with the plural gate lines GL arranged in the pixel array 110 so as to control driving timing of the plural sub-pixel SP. The gate drive circuit 113 may include at least one gate driver integrated circuit (GDIC) and may be disposed on one side or both sides of the pixel array 110 as driving types.

The data drive circuit 115 receives image data from the control circuit 117 and converts the image data to analog-type data voltage. In addition, the data drive circuit 115 outputs the data voltage to each of the data lines DL in accordance with the timing at which the gate voltage is applied through the gate line GL so that each sub-pixel SP displays brightness by the image data. The data drive circuit 115 may include at least one Source Driver Integrated Circuit (SDIC).

The control circuit 117 supplies various control signals with the gate drive circuit 113 and the data drive circuit 115 so as to control operations of the gate drive circuit 113 and the data drive circuit 115. The control circuit 117 may be a timing controller or a controller with the timing controller.

Accordingly, the control circuit 117 causes the gate drive circuit 113 to output the gate voltage by the timing implemented in each frame, and converts externally received image data to match the data signal format used by the data drive circuit 115, and then outputs the converted image data to the data drive circuit 115. The control circuit 117 may generate various control signals using externally received various timing signals and may output the control signals to the gate drive circuit 113 and the data drive circuit 115.

The display device 100, for example, a micro-LED display device, a nano-LED display device, an OLED display device or a QLED display device, may further include a power management integrated circuit that supplies various voltages or currents to the pixel array 110, the gate drive circuit 113, the data drive circuit 115, or controls various voltages or currents to be supplied. Since the display device 100 can implement more sophisticated and fine-sized pixels, it is possible to implement an ultra-high definition display device applicable to VR (Virtual Reality) and/or AR (Augmented Reality).

With describing the sub-pixel in more detail referring to FIG. 2, the sub-pixel SP includes an electro-luminescence element EL such as a micro-LED, a nano-LED, an OLED and a QLED and a pixel circuit suppling driving currents with the electro-luminescence element EL. The pixel circuit may include a driving thin film transistor DT, a switching thin film transistor ST and a capacitor Cst.

The driving thin film transistor DT may include a first electrode connected to a first power line VL1 receiving the first power EVDD and a second electrode connected to the first node N1. The driving thin film transistor DT may include a gate electrode connected to a second node N2. The driving thin film transistor DT may provide the first node N1 with driving currents in response to voltages applied to the second node N2.

The switching thin film transistor ST may include a first electrode connected to the data line DL and a second electrode connected to the second node N2. The switching thin film transistor ST may include a gate electrode connected to the gate line GL. The switching thin film transistor ST may transfer the data signal Vdata supplied to the data line DL to the second node N2 in response to the gate signal GATE transferred to the gate line GL.

The capacitor Cst may be disposed between the first node N1 and the second node N2. The capacitor Cst may include a first electrode connected to the first node N1 and a second electrode connected to the second node N2. The capacitor Cst may allow the voltage of the second node N2 to be maintained in response to the charged voltage between the first electrode and the second electrode.

The electro-luminescence element EL may include an anode electrode, a cathode electrode and an emissive layer disposed between the anode electrode and the second electrode and emitting light in response to driving current. The anode electrode may be connected to the first node N1 and the cathode electrode may be connected to a second power line supplied with the second power EVSS. In this case, the voltage level of the second power EVSS is lower than the voltage level of the first power EVDD so that the electro-luminescence element EL can receive driving current supplied to the first node N1 and can emit light.

The display device 100, for example, the μLED or the nano-LED display device, may include a compound semiconductor such as GaN, and can inject a high current therein due to the characteristics of an inorganic material so that the display device 100 can realize high luminance and has low environmental impact such as heat, moisture and oxygen, and thus can implement high reliability. Also, the display device 100, for example, the μLED or nano-LED display device, has an internal quantum efficiency of 90% so that the display device 100 can represent an image of higher luminance. Accordingly, the display device 100 has an advantage of realizing a display device with low power consumption.

In addition, since the display device 100, for example, the μLED or nano-LED display device uses inorganic material in the electro-luminescence element EL, oxygen and moisture do not little effect on the driving of the display device 100. Accordingly, there is no need for a separate encapsulation film or an encapsulation substrate to minimize or reduce the penetration of oxygen and moisture in the display device such as the μLED or nano-LED display device. Therefore, the display device 100 such as the μLED or nano-LED display device has an advantage in that non-display area of the display device, which is a margin area that may be generated by disposing the encapsulation film or the encapsulation substrate, can be reduced.

Particularly, the display device 100, for example μLED or nano-LED display device, in accordance with the present disclosure can be driven with a high current, and can improve the reliability and lifespan of the thin film transistors DT and ST, as described the following various embodiments.

First Embodiment

Figure 3:
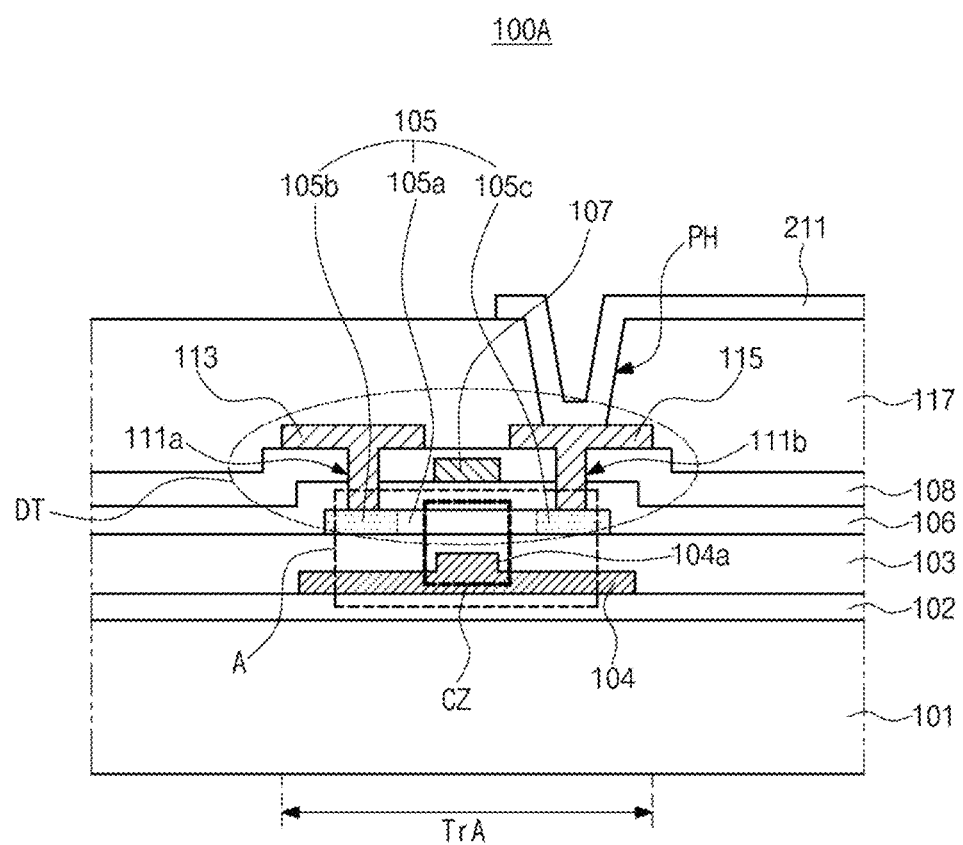
FIG. 3 is a schematic cross-sectional view illustrating an array substrate of a display device in accordance with an aspect of the present disclosure.
Figure 4:
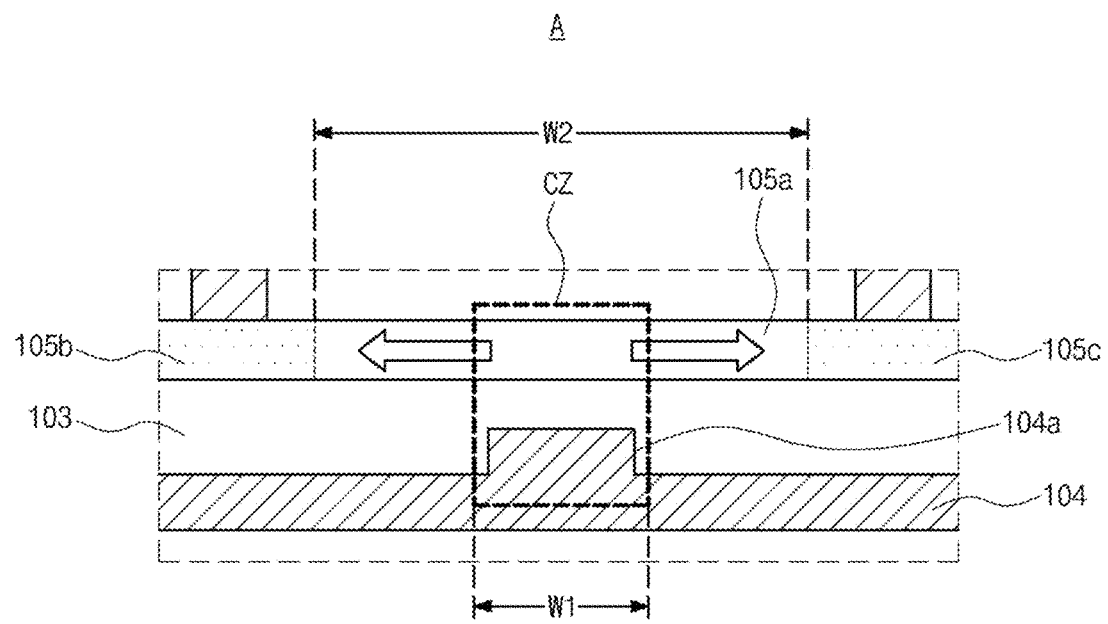
FIG. 4 is an enlarged view illustrating "A" region in FIG. 3 in detail.

FIG. 3 is a schematic cross-sectional view illustrating an array substrate of a display device in accordance with an aspect of the present disclosure and FIG. 4 is an enlarged view illustrating "A" region in FIG. 3 in detail.

As illustrated in FIG. 3, an array substrate 100A includes a substrate 101, a shield metal 104 over the substrate 101 and a driving thin film transistor DT as a thin film transistor (TFT). A multi-buffer layer 102 is coated on the substrate 101. The multi-buffer layer 102 may be a buffer layer in which plural thin films are sequentially laminated. In one aspect, the multi-buffer layer 102 may include a silicon nitride ($SiN_x$) film and a silicon oxide (SiOx) film each of which is laminated alternately. Alternatively, the multi-buffer layer 102 may include an organic film and an inorganic film each of which is repeatedly laminated alternately. The multi-buffer layer 102 acts to delay diffusion of moisture and/or oxygen penetrating into the substrate 101.

An active buffer layer 103 may be further disposed over the multi-buffer layer 102. The active buffer layer 103 for protecting an active layer 105 of the driving thin film transistor DT acts to block various types of defects introduced from the substrate 101. In one aspect, the active buffer layer 103 may be made of the same material as the multi-buffer layer 102. Alternatively, the active buffer layer 103 may be made of amorphous silicon (a-Si) or the like.

The driving thin film transistor DT is disposed over the active buffer layer 103 corresponding to a switching area TrA. The driving thin film transistor DT in accordance with the first embodiment of the present disclosure may be a driving thin film transistor including a poly-silicon material as an active layer 105, particularly a LTPS (Low Temperature Poly-Silicon) thin film transistor including LTPS as the active layer 105. Polysilicon material has high mobility, lower power consumption and excellent reliability.

In other words, the active layer 105 is disposed on the active buffer layer 103 corresponding to the switching area TrA. The active layer 105 of the LTPS thin film transistor (hereinafter, referred to as a thin film transistor) includes a channel region 105a in which a channel is formed in case of driving the driving thin film transistor DT, a source region 105b and a drain region 105c defined on (e.g., positioned on) both sides of the channel region 105a. The channel region 105a, the source region 105b and the drain region 105c are defined by (e.g., formed by) ion doping (impurity doping).

A gate insulating layer 106 is disposed on the active layer 105. The gate insulating layer 106 may have a single-layered structure made of silicon nitride ($SiN_x$) or silicon oxide ($SiO_x$), or multiple-layered structure made of silicon nitride ($SiN_x$) layer and a silicon oxide ($SiO_x$) layer.

A gate electrode 107 is disposed on the gate insulating layer 106 corresponding to the switching area TrA. The gate electrode 107 is located overlapping with or corresponding to the channel region 105a of the active layer 105. The gate line GL (FIG. 2) may be extended in one direction from the gate electrode 107.

The gate electrode 107 and the gate line GL may be made of the same material. For example, the gate electrode 107 and the gate line GL may be made of low-resistant material such as aluminum (Al), aluminum alloy such as AlNd, copper (Cu), copper alloy, Molybdenum (Mo) and/or Molybdenum-titanium (Mo—Ti). The gate electrode 107 and the gate line GL may have a single-layered structure or a multiple-layered structure such as a double- or triple-layered structure.

An interlayer insulating layer 108 is disposed over the gate electrode 107 and the gate line GL. As an example, the interlayer insulating layer 108 may be made of silicon nitride ($SiN_x$). In case of performing hydrogen process for stabilizing the active layer 105, hydrogen included in the interlayer insulating layer 108 made of silicon nitride ($SiN_x$) can be diffused into the active layer 105.

First and second contact holes 111a and 111b each of which exposes the source region 105b and the drain region 105c of the active layer 105, respectively, are formed in the gate insulating layer 106 and the interlayer insulating layer 108.

A source electrode 113 and a drain electrode 115 are disposed on the interlayer insulating layer 108 corresponding to the switching area TrA. Each of the source electrode 113 and the drain electrode 115 is connected to each of the source region 105b and the drain region 105c of the active layer 105 through the first and second contact holes 111a and 111b, respectively.

The source electrode 113 and the drain electrode 115 may be made of material with low-resistant property. For example, the source electrode 113 and the drain electrode 115 may be made of at least one of aluminum (Al), aluminum alloy such as AlNd, copper (Cu), copper alloy, molybdenum (Mo), molybdenum-titanium (Mo—Ti), chrome (Cr) and/or titanium (Ti). In addition, the data line DL (FIG. 2) crossing the gate line GL and defining (e.g., overlapping) the sub-pixel SP (FIG. 2) is disposed.

The source electrode 113, the drain electrode 115, the active layer 105 including the channel region 105a as well as the source and drain regions 105b and 105c contacting with the source and drain electrodes 113 and 115, the gate insulating layer 106 and the gate electrode 107 over the active layer 105 constitutes the driving thin film transistor DT.

The switching thin film transistor ST (FIG. 2) is connected to the driving thin film transistor DT. The switching thin film transistor ST (FIG. 2) may have the same structure as the driving thin film transistor DT.

A passivation layer 117 having a drain contact hole PH which exposes the drain electrode 115 of the driving thin film transistor DT is disposed over the source electrode 113 and the drain electrode 115. The passivation layer 117 may be made of the same material as the gate insulating layer 106 or the interlayer insulating layer 108, or of an organic insulating material for planarization of the substrate 101.

For example, the passivation layer 117 may be made of, but is not limited to, an acrylate-based resin, an epoxy-based resin, a phenol-based resin, a polyamide-based resin, a polyimide-based resin, an unsaturated polyester-based resin, a polyphenylenesulfide-based resin, benzocyclobutene and combination thereof. The passivation layer 117 may have a single-layered structure or a multiple-layered structure. As an example, the passivation layer 117 may have a thickness of about 2 μm and about 5 nm in order to cover sufficiently a step difference on the substrate 101.

An anode electrode 211 connected to the drain electrode 115 of the driving thin film transistor DT is disposed over the passivation layer 117. The anode electrode 211 may be made of metal material having high reflectance. For example, the anode electrode 211 may have a laminated structure of aluminum (Al) and titanium (Ti) (Ti/Al/Ti), a laminated structure of aluminum and ITO (indium-tin-oxide) (ITO/Al/ITO), an APC alloy (Ag/Pd/Cu) and/or a laminated structure of an APC alloy and ITO (ITO/APC/ITO).

The anode electrode 211 is disposed at each sub-pixel SP (FIG. 2) and a bank is disposed among the anode electrode 211 disposed at each sub-pixel SP. The anode electrode 211 has a structure separated for each sub-pixel SP by the bank as a boundary for each sub-pixel SP.

The array substrate 100A with the thin film transistor DT in accordance with the first embodiment of the present disclosure includes a shield metal 104 (bottom shield metal) disposed between the multi-buffer layer 102 and the active buffer layer 103 under the active layer 105. The shield metal 104 may be disposed corresponding to the switching area TrA. The shield metal 104 may be made of metal material such as molybdenum (Mo), but is not limited thereto. The shield metal 104 blocks light reflected from the bottom of the substrate 101. The shield metal 104 function as blocking leakage currents of the active layer 105 and suppresses fluctuations of element properties such as threshold voltage in the driving thin film transistor DT due to externally-introduced moisture. Therefore, the shield metal 104 can prevent occurrence of stains, afterimages and the likes due to luminance imbalance among sub-pixels SPs. In addition, the shield metal 104 serves to minimize or reduce physical damage to the driving thin film transistor DT during manufacturing the array substrate 100A.

The array substrate 100A defines (e.g., includes) a cooling zone CZ between the channel region 105a in the active layer of the driving thin film transistor DT and the shield metal 104 by the shield metal 104. More particularly, the shield metal 104 includes a protrusion 104a protruded toward the channel region 105a as a thermal gradient portion. Since the shield metal 104 is made of metal material such as molybdenum (Mo), when heat is generated from the channel region 105a, the heat generated from the channel region 105a is transferred to the shield metal 104 through the protrusion 104a disposed adjacently to the channel region 105a. Therefore, the cooling zone CZ is defined (e.g., positioned) between the channel region 105a and the shield metal 104 corresponding to the protrusion 104a formed in the shield metal 104. In one aspect, the protrusion 104a may be positioned closer to the drain region 105c than the source region 105b.

As the high-temperature heat generated from the channel region 105a is transferred rapidly to the shield metal 104 through the protrusion 104a, the heat generated in the active layer 105 can be diffused rapidly to the surroundings through the shield metal 104. Since the heat dissipation of the thin film transistor DT on driving is facilitated, it is possible to prevent deterioration of the reliability, lifespan and driving speed of the thin film transistor DT due to heat of the thin film transistor DT.

In addition, when the protrusion 104a of the shield metal 104 is formed to have a width W1 narrower than a width W2 of the channel region 105a, heat flow is formed in the channel region 105a defining (e.g., overlapping) the cooling zone CZ. This affects grain growth in the channel region 105a.

As illustrated in FIG. 4, a thermal or temperature gradient is generated in the channel region 105a through the cooling zone CZ defined (e.g., positioned) correspondingly to the protrusion 104a in the shield metal 104. During the crystallization process in the channel region 105a, grain growth proceeds more rapidly at a low temperature. Crystal nuclei are first generated in the cooling zone CZ in the channel region 105a, and then the generated crystal nuclei grow gradually outwardly to the cooling zone CZ over time. Since the grain size in the cooling zone CZ in the channel region 105a becomes larger than the grain size in the regions other than the cooling zone CZ in the channel region 105a, the operating properties of the thin film transistor DT can be improved.

The grain boundary is a barrier that hinders the progress of charges such as electrons or holes and acts as a charge trap site. As the grain size increases, the area of the grain boundary through which electrons or holes must travel becomes smaller and the speed of the electrons or holes increases. In other words, the grain boundary acting as charge trap site in the cooling zone CZ of the channel region 105a is reduced, which in turn increases the electric field effect mobility of the thin film transistor DT made of polysilicon, thereby improving the electrical properties of the thin film transistor DT. Therefore, it is possible to implement high-speed driving of the thin film transistor DT. In addition, the cooling zone CZ in the channel region 105a has low defect density so that the driving thin film transistor DT can improve its reliability and lifespan.

The array substrate 100A in accordance with the first aspect of the present disclosure includes the shield metal 104 disposed under the active layer 105 and with the protrusion 104a having the width W1 narrower than the width W2 of the channel region 105a. Since the high-temperature heat generated from the channel region 105a can be rapidly diffused to the surroundings of the channel region 105a, heat dissipation of the thin film transistor DT on driving can be facilitated. The thin film transistor DT can improve its reliability, lifespan and driving speed.

In addition, the thermal gradient in the channel region 105a cause the crystal to grow in the lateral direction from the cooling zone CZ. Accordingly, it is possible to increase the field effect mobility of the thin film transistor DT made of polysilicon and to implement high-speed driving of the thin film transistor DT. Also, since the cooling zone CZ of the channel region 105a has little direct density, the reliability and lifespan of the thin film transistor DT can be further improved.

Figure 5A:
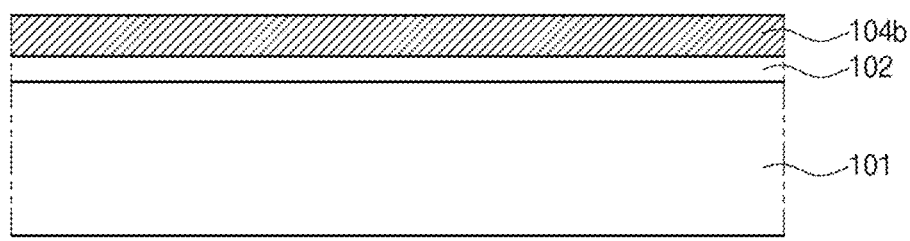
FIGS. 5A to 5E illustrate schematically process steps of a protrusion formed on a metal array as a thermal gradient portion in accordance with an aspect of the present disclosure.
Figure 5B:
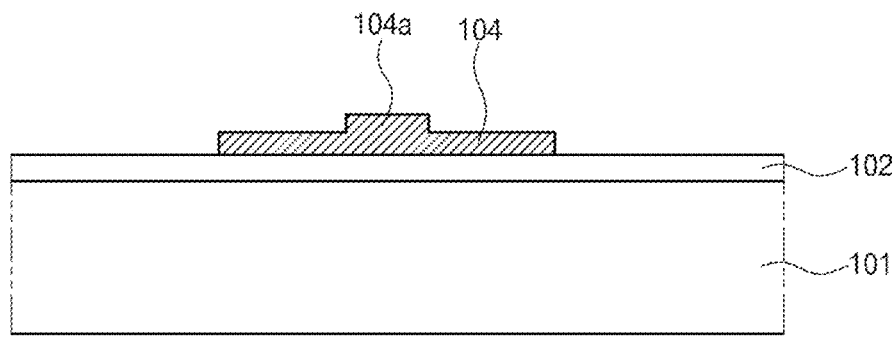

FIGS. 5A to 5E illustrate schematically process steps of manufacturing an array substrate in which a protrusion formed on a metal as a thermal gradient portion in accordance with an aspect of the present disclosure. As illustrated in FIG. 5A, a bottom shield metal layer 104b is formed over the substrate 101 on which the multi-buffer layer 102 is formed. Then, as illustrated in FIG. 5B, the shield metal 104 including the protrusion 104a is formed on the substrate 101 using a half-tone mask or a diffraction (slit) mask.

Figure 5C:
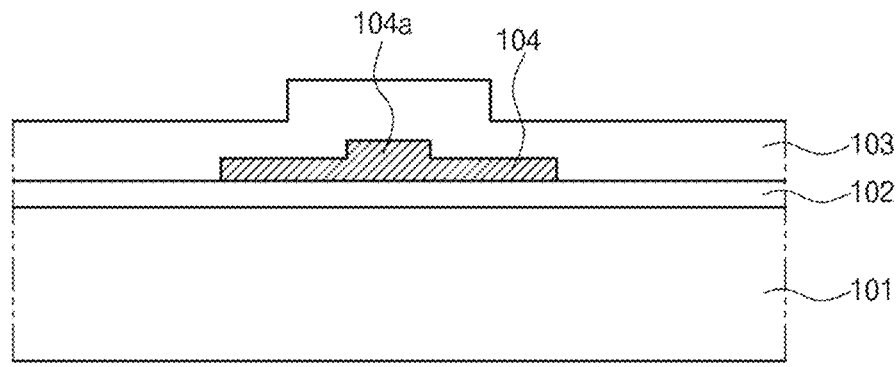
Figure 5D:
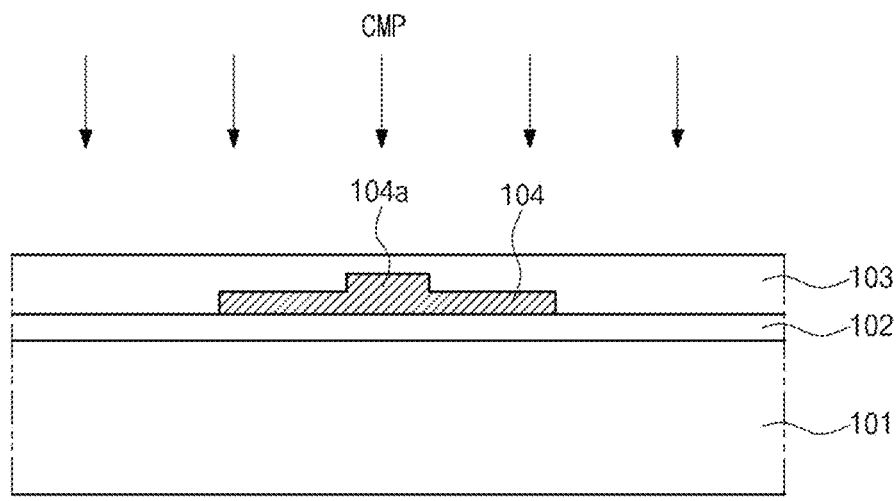
Figure 5E:
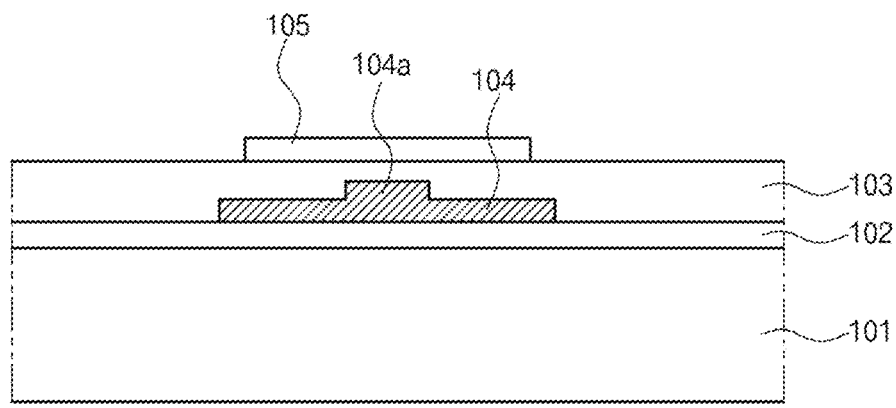

Next, as illustrated in FIG. 5C, the active buffer layer 103 is formed on the shield metal 104 with the protrusion 104a. The active buffer layer 103 is formed with a step difference along the step difference of the protrusion 104a. Then, as illustrated in FIG. 5D, after the active buffer layer 103 is flattened through a Chemical Mechanical Polishing (CMP) process, as illustrated in FIG. 5E, the active layer 105 is formed on the active buffer layer 103.

Thereafter, although not shown, after performing dehydrogenation process of the active layer 105, the crystallization process of the active layer 105 is performed. After patterning the active layer 105, a process of forming the gate electrode 107 and source and drain electrodes 113 and 115 over the active layer 105 is performed so that the driving thin film transistor DT including the source electrode 113, the drain electrode 115, the active layer 105 and the gate electrode 107.

Second Embodiment

Figure 6:
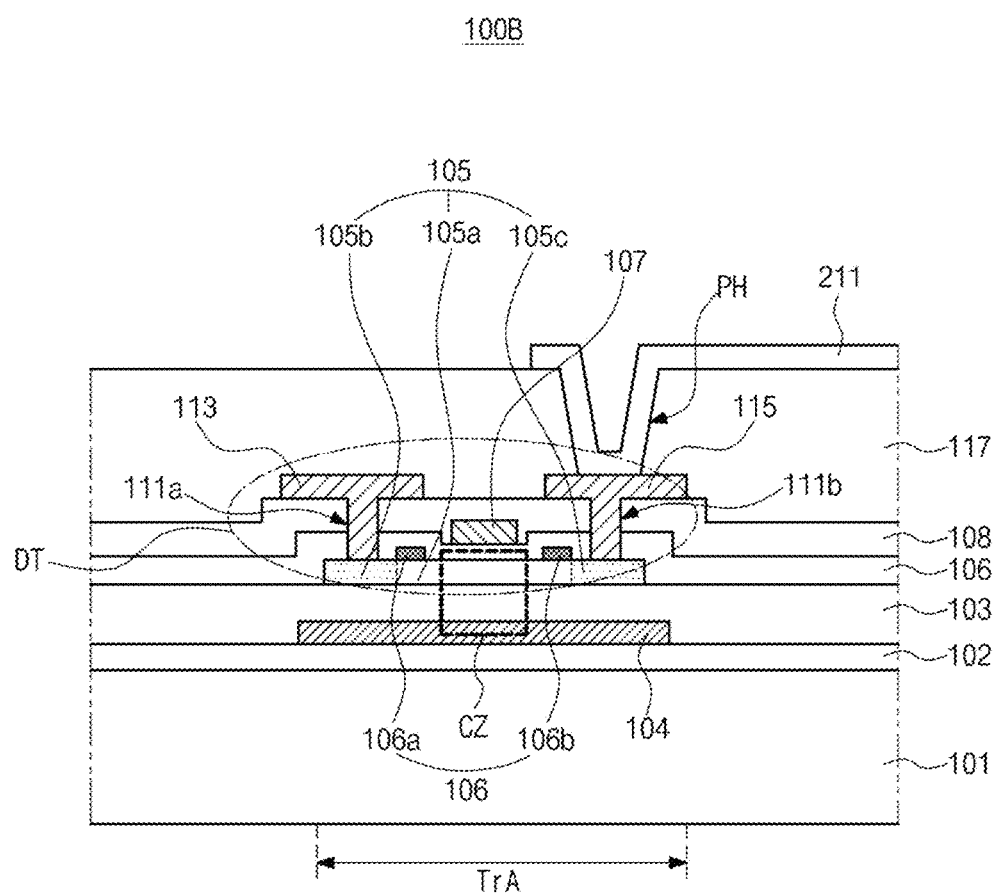
FIG. 6 is a schematic cross-sectional view illustrating an array substrate of a display device in accordance with another aspect of the present disclosure.

FIG. 6 is a schematic cross-sectional view illustrating an array substrate of a display device in accordance with another aspect of the present disclosure. As illustrated in FIG. 6, an array substrate 100B includes a substrate 101 and a driving thin film transistor DT over the substrate. The multi-buffer layer 102 coated on the substrate 101 acts to delay the diffusion of moisture and/or oxygen penetrating into the substrate 101.

The shield metal (bottom shield metal) 104 is disposed on the multi-buffer layer 102 correspondingly to the switching area TrA. The shield metal 104 may include the metal material such as molybdenum (Mo).

The active buffer layer 103 for protecting the active layer 105 of the driving thin film transistor DT may be further disposed on the shield metal 104. The active buffer layer 103 functions to block various types of defects introduced from the substrate 101.

The driving thin film transistor DT is disposed on the active buffer layer 103 correspondingly to the switching area TrA. The thin film transistor DT in accordance with the second embodiment of the present disclosure may be a driving thin film transistor including a poly-silicon material as an active layer 105, particularly a LTPS (Low Temperature Poly-Silicon) thin film transistor including LTPS as the active layer 105.

More particularly, the active layer 105 is disposed on the active layer 103 correspondingly to the switching area TrA. The active layer 105 of the LTPS thin film transistor includes the channel region 105a in which a channel is formed in case of driving the driving thin film transistor DT, the source region 105b and the drain region 105c defined on both sides of the channel region 105a. The channel region 105a, the source region 105b and the drain region 105c are defined by ion doping (impurity doping).

The array substrate 100B in accordance with the second embodiment of the present disclosure includes a heat cover 106a on the channel region 105a. As an example, the heat cover 106a may be disposed along a periphery or an edge of the channel region 105a on the channel region 105a. As the heat cover 106a exposes a part of the channel region 105a, for example, a central area of the channel region 105a, a cooling zone CZ is defined between the channel regions 105a exposed by the heat cover 106a and the shield metal 104.

The heat cover 106a may have a single-layered structure of silicon nitride ($SiN_x$) or silicon oxide ($SiO_x$), or a multiple-layered structure of silicon nitride ($SiN_x$) or silicon oxide ($SiO_x$). An area (e.g., edge or peripheral area) of the channel region 105a on which the heat cover is disposed has relatively high temperate than an area (e.g., central area) of the channel region 105a on which the heat cover 106a is not disposed, exposed by the heat cover 106a. Accordingly, the cooling zone CZ is defined in the channel region 105a exposed by the heat cover 106a.

A part of the channel region 105a is exposed by the heat cover 106a so that a width of the cooling zone is narrower than a width of the channel region 105a. Heat flow through the narrowly exposed area is formed in the channel region 105a, which effects on the grain growth in the channel region 105a.

In other words, a thermal or temperature gradient is generated in the channel region 105a through the cooling zone CZ. During the crystallization process in the channel region 105a, grain growth proceeds more rapidly at a low temperature. Crystal nuclei are first generated in the cooling zone CZ in the channel region 105a, and then the generated crystal nuclei grow gradually outward of the cooling zone CZ over time. Since the grain size in the cooling zone CZ in the channel region 105a becomes larger than the grain size in the regions other than the cooling zone CZ, the operating properties of the thin film transistor DT are improved.

The grain boundary acting as charge trap site in the cooling zone CZ of the channel region 105a is reduced, which in turn increases the electric field effect mobility of the thin film transistor DT made of polysilicon, thereby improving the electrical properties of the thin film transistor DT. Therefore, it is possible to implement high-speed driving of the thin film transistor DT. In addition, the cooling zone CZ in the channel region 105a has low defect density so that the driving thin film transistor DT can improve its reliability and lifespan.

The gate insulating layer 106 is disposed on the active layer 105 and the gate electrode 107 is disposed on the gate insulating layer 106 correspondingly to the switching area TrA. The gate electrode 107 is disposed overlapping to the channel region 105a of the active layer 105.

The interlayer insulating layer 108 is disposed over the gate electrode 107. First and second contact holes 111a and 111b each of which exposes the source region 105b and the drain region 105c of the active layer 105 are formed in the gate insulating layer 106 and the interlayer insulating layer 108.

The source electrode 113 and the drain electrode 115 are disposed on the interlayer insulating layer 108 corresponding to the switching area TrA. Each of the source electrode 113 and the drain electrode 115 is connected to each of the source region 105b and the drain region 105c of the active layer 105 through the first and second contact holes 111a and 111b, respectively.

The passivation layer 117 having the drain contact hole PH which exposes the drain electrode 115 of the driving thin film transistor DT is disposed over the source electrode 113 and the drain electrode 115. The anode electrode 211 connected to the drain electrode 115 of the driving thin film transistor DT is disposed over the passivation layer 117.

The array substrate 100B in accordance with the second embodiment of the present disclosure includes the heat cover 106a that is disposed on the channel area 105a and exposes a part of the channel area 105a so that the cooling zone CZ is defined between the channel area 105a and the shield metal 104.

Accordingly, as heat or temperature gradient are generated in the channel region 105a. The polysilicon crystal grows in the lateral direction from the cooling zone CZ, the electric field effect mobility of the thin film transistor DT made of polysilicon is increased, and thus, it is possible to implement high-speed driving of the thin film transistor DT. In addition the cooling zone CZ in the channel region 105a has low defect density so that the driving thin film transistor DT can enhance its reliability and lifespan.

While the heat cover 106a covers a top area of the channel region 105a except the cooling zone CZ in the channel region 105a in FIG. 6, the heat cover 106a may cover the whole area of the active layer 105 except the cooling zone CZ in the channel region 105a. When the heat cover 106a covers the whole area of the active layer 105 except the cooling zone CZ, the first and second contact holes 111a and 111b each of which exposes the source region 105a and the drain region 105c, respectively, are formed in the heat cover 106a as well as the gate insulating layer 106 and the interlayer insulating layer 108.

Third Embodiment

Figure 7:
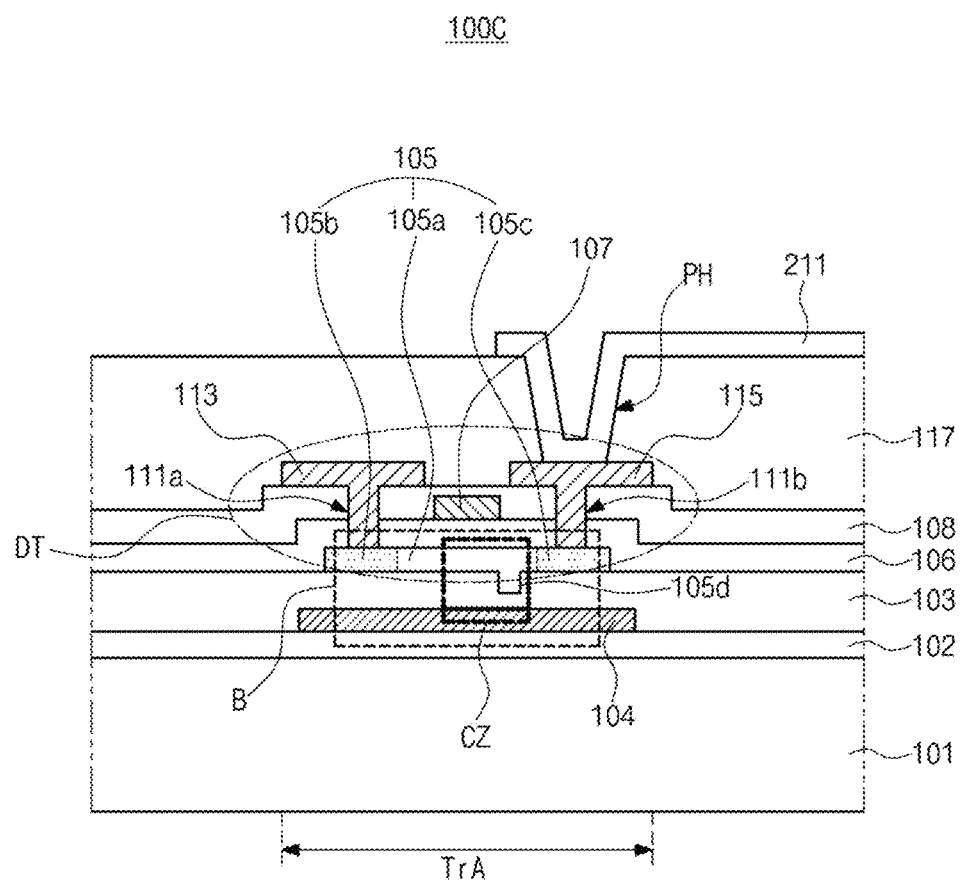
FIG. 7 is a schematic cross-sectional view illustrating an array substrate of a display device in accordance with still another aspect of the present disclosure.
Figure 8:
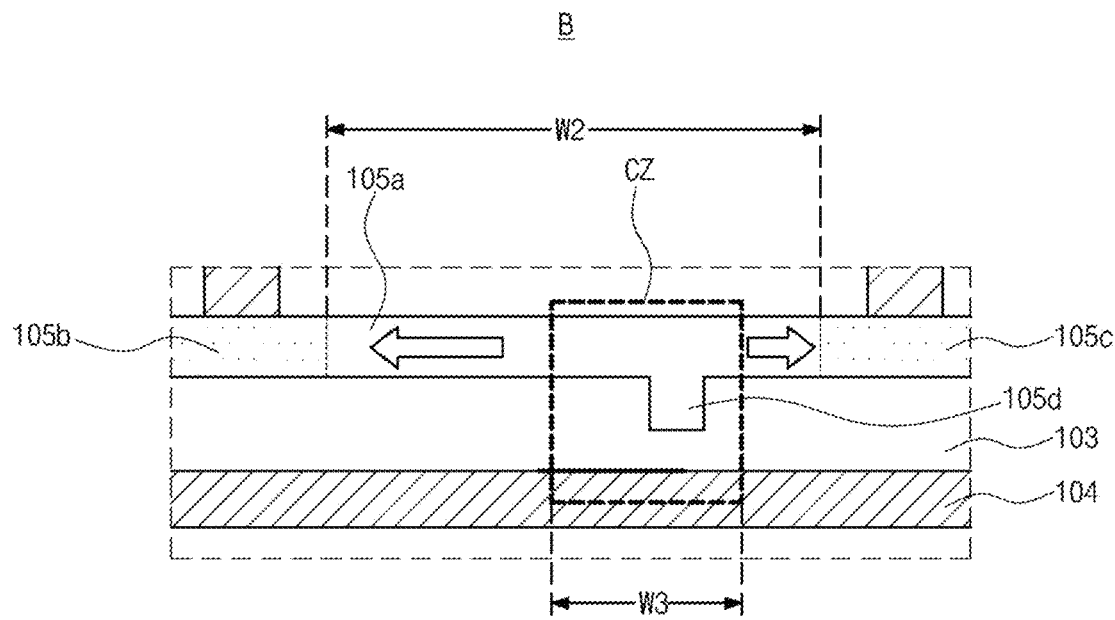
FIG. 8 is an enlarged view illustrating "B" region in FIG. 7 in detail.
Figure 9:
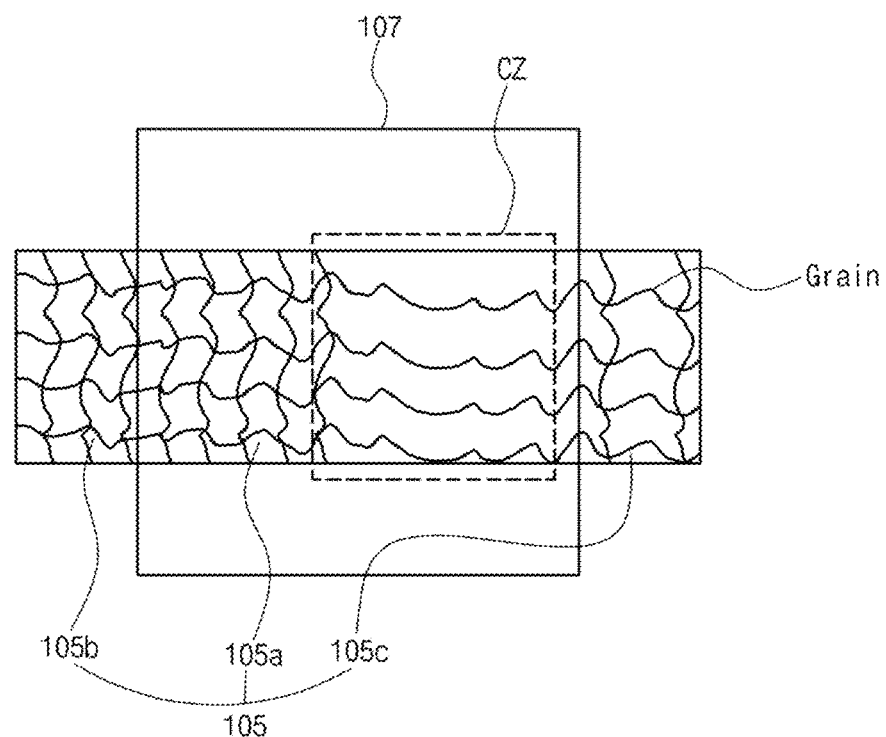
FIG. 9 is a plain view illustrating the cooling zone in FIG. 7.
Figure 10A:
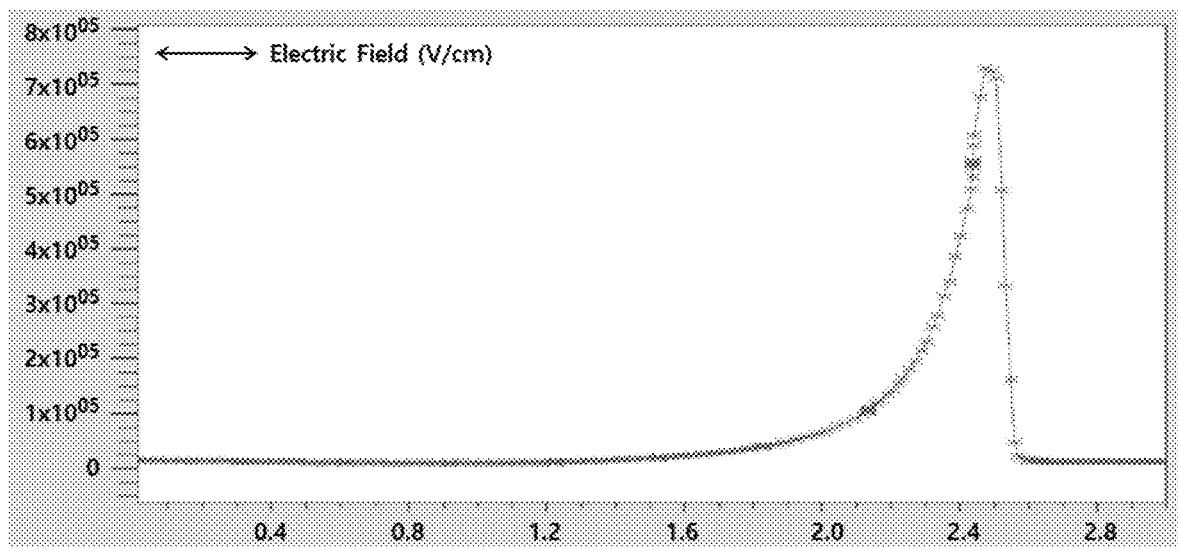
FIGS. 10A and 10B are graphs showing electric field for each area of the active layer in accordance with the thickness of the active layer.
Figure 10B:
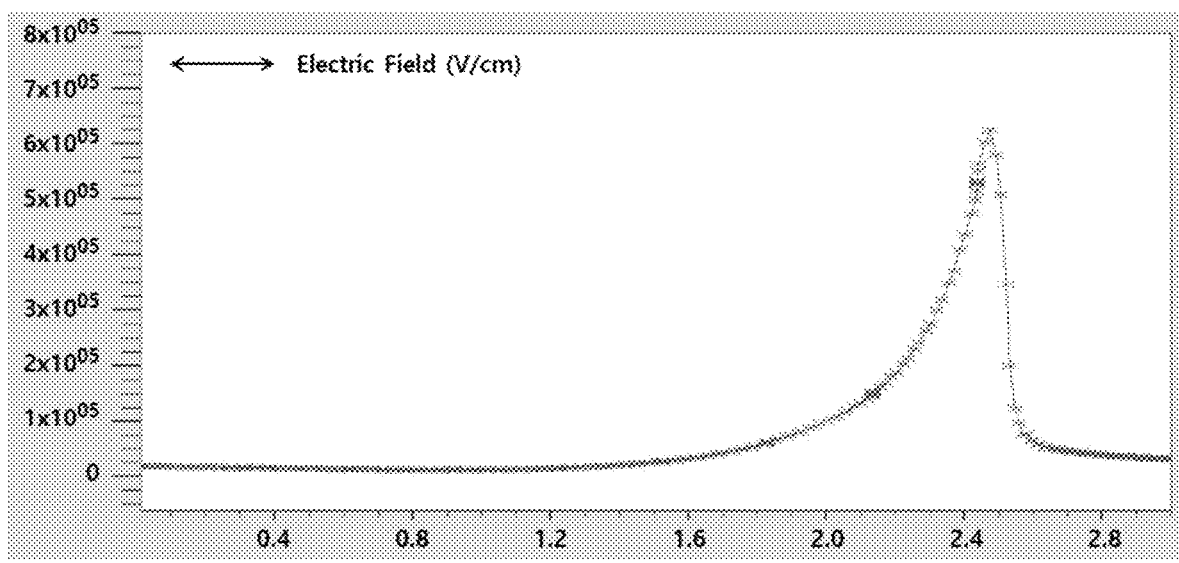

FIG. 7 is a schematic cross-sectional view illustrating an array substrate of a display device in accordance with still another aspect of the present disclosure, FIG. 8 is an enlarged view illustrating "B" region in FIG. 7 in detail and FIG. 9 is a plain view illustrating the cooling zone in FIG. 7. FIGS. 10A and 10B are graphs showing electric filed for each area of the active layer in accordance with the thickness of the active layer.

As illustrated in FIG. 7, an array substrate 100C includes a substrate 101, a shield metal 104 over the substrate 101 and a driving thin film transistor DT as a thin film transistor (TFT) over the shield metal 104.

The multi-butter layer 102 coated on the substrate 101 is a buffer layer in which a plurality of thin films are sequentially laminated. In one aspect, the multi-buffer layer 102 may include a silicon nitride ($SiN_x$) film and a silicon oxide (SiOx) film each of which is laminated alternately. Alternatively, the multi-buffer layer 102 may include an organic film and an inorganic film each of which is repeatedly laminated alternately. The multi-buffer layer 102 acts to delay diffusion of moisture and/or oxygen penetrating into the substrate 101.

The shield metal 104 (bottom shield metal) is disposed over the multi-buffer layer 102 correspondingly to a switching area TrA. The shield metal 104 may be made of metal material such as molybdenum (Mo). The shield metal 104 blocks light reflexed from the bottom of the substrate 101 and function as blocking leakage currents of the active layer 105 and suppressing fluctuations of element properties such as threshold voltage in the driving thin film transistor DT due to externally-introduced moisture. Therefore, the shield metal 104 can prevent occurrence of stains, afterimages and the likes due to luminance imbalance among sub-pixels SPs. In addition, the shield metal 104 serves to minimize or reduce physical damage to the driving thin film transistor DT during manufacturing the array substrate 100C.

The active buffer layer 103 may be further disposed over the shield metal 104. The active buffer layer 103 for protecting the active layer 105 of the driving thin film transistor DT acts to block various types of defects introduced from the substrate 101. In one aspect, the active buffer layer 103 may be made of the same material as the multi-buffer layer 102. Alternatively, the active buffer layer 103 may be made of amorphous silicon (a-Si) or the like.

The driving thin film transistor DT is disposed over the active buffer layer 103 corresponding to the switching area TrA. The driving thin film transistor DT in accordance with the third embodiment of the present disclosure may be a driving thin film transistor including a poly-silicon material as an active layer 105, particularly a LTPS thin film transistor including LTPS as the active layer 105. Polysilicon materials have high mobility, lower power consumption and excellent reliability.

In other words, the active layer 105 is disposed on the active buffer layer 103 corresponding to the switching area TrA. The active layer 105 of the LTPS thin film transistor (hereinafter, referred to as a thin film transistor) includes a channel region 105a in which a channel is formed in case of driving the driving thin film transistor DT, a source region 105b and a drain region 105c defined on both sides of the channel region 105a. The channel region 105a, the source region 105b and the drain region 105c are defined by ion doping (impurity doping).

A gate insulating layer 106 is disposed on the active layer 105. The gate insulating layer 106 may be a single layer made of silicon nitride ($SiN_x$) or silicon oxide ($SiO_x$), or multiple layers made of silicon nitride ($SiN_x$) layer and a silicon oxide ($SiO_x$) layer.

A gate electrode 107 is disposed on the gate insulating layer 106 corresponding to the switching area TrA. The gate electrode 107 is located overlapping with or corresponding to the channel region 105a of the active layer 105. A gate line GL may be extended in one direction from the gate electrode 107.

The gate electrode 107 and the gate line GL may be made of the same material. For example, the gate electrode 107 and the gate line GL may be made of low-resistant metal such as aluminum (Al), aluminum alloy such as AlNd, copper (Cu), copper alloy, Molybdenum (Mo) and/or Molybdenum-titanium (Mo—Ti). The gate electrode 107 and the gate line GL may have a single-layered structure or a multiple-layered structure such as a double- or triple-layered structure.

An interlayer insulating layer 108 is disposed over the gate electrode 107 and the gate line GL. As an example, the interlayer insulating layer 108 may be made of silicon nitride ($SiN_x$). In case of performing hydrogen process for stabilizing the active layer 105, hydrogen included in the interlayer insulating layer 108 made of silicon nitride ($SiN_x$) can be diffused into the active layer 105.

First and second contact holes 111a and 111b each of which exposes the source region 105b and the drain region 105c of the active layer 105 are formed in the gate insulating layer 106 and the interlayer insulating layer 108.

A source electrode 113 and a drain electrode 115 are disposed on the interlayer insulating layer 108 corresponding to the switching area TrA. Each of the source electrode 113 and the drain electrode 115 is connected to each of the source region 105b and the drain region 105c of the active layer 105 through the first and second contact holes 111a and 111b, respectively.

The source electrode 113 and the drain electrode 115 may be made of metal with low-resistant property. For example, the source electrode 113 and the drain electrode 115 may be made of at least one of aluminum (Al), aluminum alloy such as AlNd, copper (Cu), copper alloy, molybdenum (Mo), molybdenum-titanium (Mo—Ti), chrome (Cr) and/or titanium (Ti). In addition, the data line DL crossing the gate line GL and defining the sub-pixel SP is disposed.

The source electrode 113, the drain electrode 115, the active layer 105 including the channel region 105a as well as the source and drain regions 105b and 105c contacting with the source and drain electrodes 113 and 115, the gate insulating layer 106 and the gate electrode 107 over the active layer 105 constitutes the driving thin film transistor DT.

The switching thin film transistor ST (FIG. 2) is connected to the driving thin film transistor DT. The switching thin film transistor ST may have the same structure as the driving thin film transistor DT.

A passivation layer 117 having a drain contact hole PH which exposes the drain electrode 115 of the driving thin film transistor DT is disposed over the source electrode 113 and the drain electrode 115. The passivation layer 117 may be made of the same material as the gate insulating layer 106 or the interlayer insulating layer 108, or of an organic insulating material for planarization of the substrate 101.

For example, the passivation layer 117 may be made of, but is not limited to, acrylate-based resin, epoxy-based resin, phenol-based resin, polyamide-based resin, polyimide-based resin, unsaturated polyester-based resin, polyphenylenesulfide-based resin and/or benzocyclyobutene. The passivation layer 117 may have a single-layered structure or a multiple-layered structure. As an example, the passivation layer 117 may have a thickness of about 2 μm and about 5 nm in order to sufficiently cover enough a step difference on the substrate 101.

An anode electrode 211 connected to the drain electrode 115 of the driving thin film transistor DT is disposed over the passivation layer 117. The anode electrode 211 may be made of metal material having high reflectance. For example, the anode electrode 211 may have a laminated structure of aluminum (Al) and titanium (Ti) (Ti/Al/Ti), a laminated structure of aluminum and ITO (indium-tin-oxide) (ITO/Al/ITO), APC alloy (Ag/Pd/Cu) and/or a laminated structure of APC alloy and ITO (ITO/APC/ITO).

The anode electrode 211 is disposed at each sub-pixel SP (FIG. 2) and a bank is disposed among the anode electrode 211 disposed at each sub-pixel SP. The anode electrode 211 has a structure separated for each sub-pixel SP by the bank as a boundary for each sub-pixel SP.

The channel region 105a includes a protrusion rib 105d protruded toward the shield metal 104 as a thermal gradient portion so that the array substrate 100C with the thin film transistor DT in accordance with the third embodiment of the present disclosure defines a cooling zone (CZ) between the channel region 105a of the active layer 105 and the shield metal 104. Since the shield metal 104 is made of metal material such as molybdenum (Mo), when heat is generated from the channel region 105a, the heat generated from the channel region 105a is transferred to the shield metal 104 disposed adjacently to the channel region 105a through the protrusion rib 105d. Therefore, the cooling zone CZ is defined between the channel region 105a and the shield metal 104 corresponding to the protrusion rib 105d formed in the channel region 105a.

As the high-temperature heat generated from the channel region 105a is transferred to the shield metal 104 through the protrusion rib 105d, the heat generated in the active layer 105 can be diffused rapidly to the surroundings through the shield metal 104. Since the heat dissipation of the thin film transistor DT on driving is facilitated, it is possible to prevent deterioration of the reliability, lifespan and driving speed of the thin film transistor TD due to heat of the thin film transistor DT.

In addition, heat flow is formed in the channel region 105a with the protrusion rib 105d defining the cooling zone CZ. This affects grain growth in the channel region 105a. More particularly, as illustrated in FIG. 8, a width W3 of the cooling zone CZ defined by the protrusion rib 105d is narrower than a width W2 of the channel region 105a so that a thermal or temperature gradient is generated in the channel region 105a through the cooling zone CZ defined correspondingly to the protrusion rib 105d.

During the crystallization process in the channel region 105a, grain growth proceeds more rapidly at a low temperature. Crystal nuclei are first generated in the cooling zone CZ in the channel region 105a. As the channel region 105a includes the protrusion rib 105d in the cooling zone CZ, crystal nuclei are first generated in a central area of the channel region 105a that corresponds to the protrusion rib 105d and is thicker than other channel region 105a, and then the generated crystal nuclei grow gradually outward of the cooling zone CZ over time. Since the grain size in the cooling zone CZ in the channel region 105a becomes larger than the grain size in the regions other than the cooling zone CZ, the operating properties of the thin film transistor DT are improved.

The grain boundary is a barrier that hinders the progress of charges such as electrons or holes and acts as a charge trap site. As the grain size increases, the area of the grain boundary through which electrons or holes must travel becomes smaller and the speed of the electrons or holes increases. In other words, the grain boundary acting as charge trap site in the cooling zone CZ of the channel region 105a is reduced, which in turn increases the electric field effect mobility of the thin film transistor DT made of polysilicon, thereby improving the electrical properties of the thin film transistor DT. Therefore, it is possible to implement high-speed driving of the thin film transistor DT. In addition, the cooling zone CZ in the channel region 105a has low defect density so that the driving thin film transistor DT can improve its reliability and lifespan.

As an example, protrusion rib 105d defining the cooling zone CZ in the channel region 105a may be disposed closer to the drain region 105c than the source region 105b because the larger grain is formed adjacent to the protrusion rib 105d. In this case, the driving thin film transistor DT in accordance with the third embodiment of the present disclosure can improve the Kink effect and maintain a higher driving current.

The Kink effect refers to a phenomenon in which the current Ids flowing through the drain electrode 115 rapidly increase and thus the saturation state of the current Ids is not reached as the drain-source voltage Vds increases when the gate-source voltage Vgs becomes large. Due to the Kink effect, as the voltage in the thin film transistor increases, the current in the thin film transistor DT is not stabilized and is unstably raised continuously, and therefore, the thin film transistor DT cannot or may not be driven stably. The Kink effect is mainly caused by a carrier concentration phenomenon at the junction between channel region 105a and the drain region 105c of the active layer 105.

FIGS. 10A and 10B are graphs showing electric filed for each area of the active layer in accordance with the thickness of the active layer. FIG. 10A indicates the driving thin film transistor DT in which the active layer 105 has a thickness of 30 nm and FIG. 10B indicates the driving thin film transistor DT in which the active layer 105 with a thickness of 100 nm. The horizontal axis of the graph indicates the unit of length in microns and the vertical axis indicates the electric filed as represented by the unit of V/cm.

Referring to FIGS. 10A and 10B, it can be seen that the electric filed is concentrated in an area which is the peripheral area of the channel region 105a adjacently to the drain region 105c. This is because the carrier concentration phenomenon occurs at the junction between the channel region 105a and the drain region 105c of the active layer 105 due to the Kink effect, and as the voltage increase, the current is not stabilized and continues to rise in an unstable manner.

In this case, it can be seen that the electric filed concentration phenomenon is alleviated as the thickness of the active layer 105 increases. This is because the thicker the active layer 105, the lower the temperature of the active layer 105, which promotes the grain growths, so that the grain size becomes larger than the grain size of the thinner active layer 105, which causes the area of the grain boundary to become small, and thus the active layer 105 has a low defect density.

In other words, the cooling zone CZ, more precisely, the protrusion rib 105d of the channel region 105a is positioned closer to the drain region 105c than the source region 105b in the thin film transistor DT in accordance with the present disclosure so that the area corresponding to the protrusion rib 105d in the channel region 105a is formed to be relatively thick. The grain boundary decreases and has a low defect density in the area corresponding to the protrusion rib 105d. Accordingly, the carrier concentration phenomenon at the junction site between the channel region 105a and the drain region 105c is improved so that the Kink effect can be improved. In addition, as the thin film transistor DT defines the cooling zone CZ with the channel region 105a that has decreased grain boundary and low defect density, electrons or holes can be more easily moved from the source region 105b to the drain region 105c, the on-state current Ion can be increased, and the switching properties can also be improved.

Figure 11A:
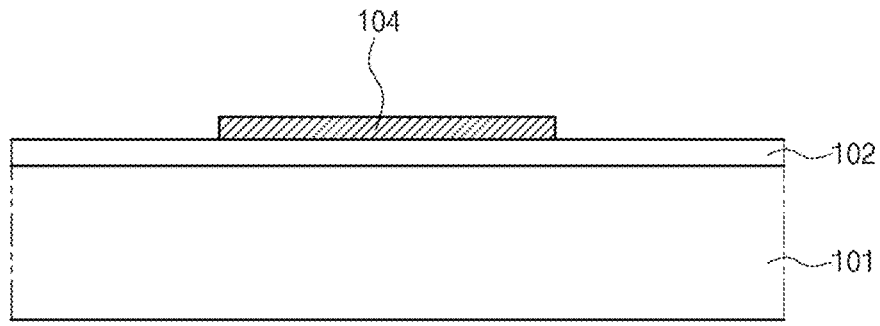
FIGS. 11A to 11D illustrates schematically process steps of an active layer including a protrusion rib as a thermal gradient portion in accordance with still another aspect of the present disclosure.
Figure 11B:
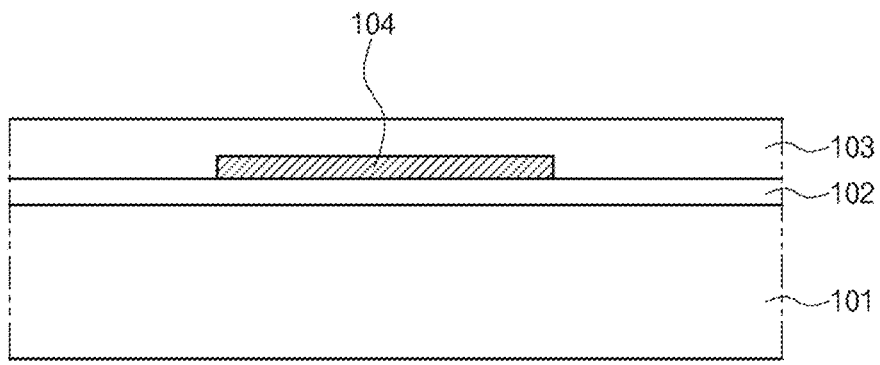
Figure 11C:
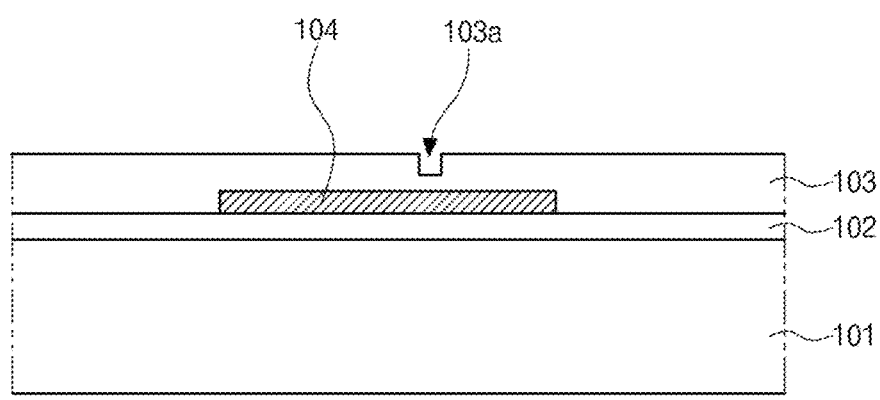
Figure 11D:
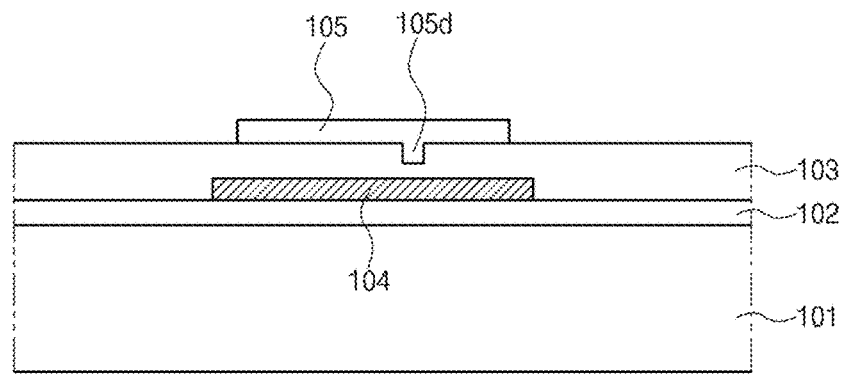

FIGS. 11A to 11D illustrates schematically process steps of manufacturing an array substrate with an active layer including a protrusion rib as a thermal gradient portion in accordance with still another aspect of the present disclosure. As illustrated in FIG. 11A, a bottom shield metal 104 is formed over the substrate 101 on which the multi-buffer layer 102 is formed. Then, as illustrated in FIG. 11B, the active buffer layer 103 is formed on the shield metal 104. Then, as illustrated in FIG. 11C, a groove 103a is formed in the active buffer layer 103 corresponding to the protrusion rib 105d of the channel region 105a to be formed through a photolithography process using a halftone mask or a diffraction (slit) mask. Then, as illustrated in FIG. 11D, the active layer 105 is disposed on the active buffer layer 103 so that the active layer 105 with the protrusion rib 105d corresponding to the groove 103a of the active buffer layer 103 is formed.

Thereafter, although not shown, after performing dehydrogenation process of the active layer 105, the crystallization process of the active layer 105 is performed. After patterning the active layer 105, a process of forming the gate electrode 107 and source and drain electrodes 113 and 115 over the active layer 105 is performed so that the driving thin film transistor DT including the source electrode 113, the drain electrode 115, the active layer 105 and the gate electrode 107.

As described above, the array substrate 100C in accordance with the third embodiment of the present disclosure includes the channel region 105a with the protrusion rib 105d protruded toward the bottom shield metal 104. Since the high-temperature heat generated from the channel region 105a can be rapidly dissipated, it is possible to prevent the reliability, lifespan and driving speed of the thin film transistor DT due to the heat from being deteriorated.

In addition, since the filed effect mobility of the thin film transistor DT is increased through the cooling zone defined between the channel region 105a and the shield metal 104, the electrical properties of the thin film transistor DT are improved, which enables the thin film transistor DT to be operated at high speed, and thus, the reliability and lifespan of the thin film transistor DT are also improved.

In particular, the thin film transistor DT defines the cooling zone CZ with the protrusion rib 105d that is positioned to be more adjacent to the drain region 105c than the source region 105b in the channel region 105. The thin film transistor DT in accordance with the third embodiment of the present disclosure can improve the Kink effect, maintain a higher driving current, increase the on-current Ion, and improve its switching properties.

Figure 12:
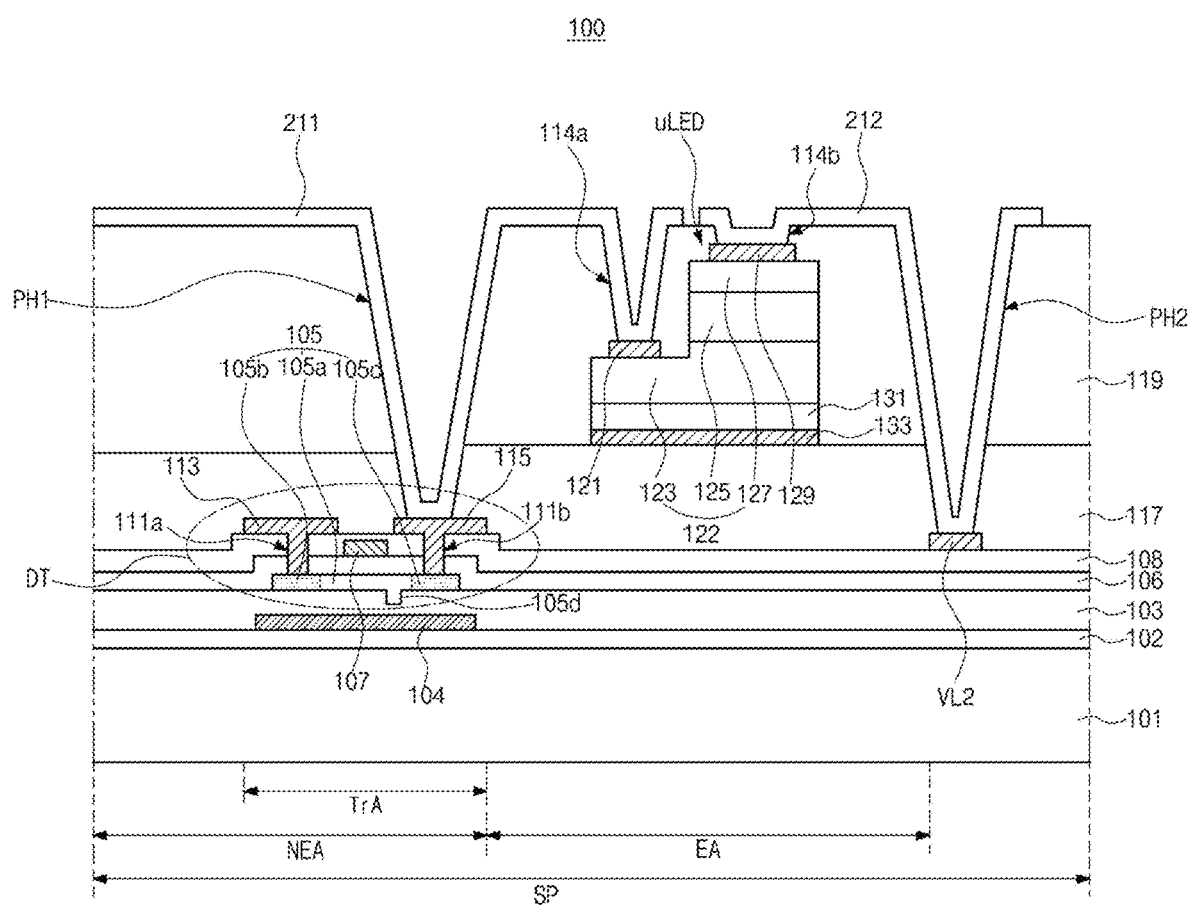
FIG. 12 is a schematic cross-sectional view illustrating a sub-pixel of light-emitting display device including an array substrate in accordance with still another aspect of the present disclosure.

FIG. 12 is a schematic cross-sectional view illustrating a sub-pixel of light-emitting display device including an array substrate in accordance with still another aspect of the present disclosure. As illustrated in FIG. 12, a display device 100 includes a substrate 101 defining a sub-pixel SP, a shield metal 104, a thin film transistor DT and a micro-LED μLED as an electro-luminescence element EL (FIG. 2) electrically connected to the thin film transistor DT. Alternatively, other electro-luminescene element EL such as OLED, QLED or nano-LED can be electrically connected to the thin film transistor DT.

The sub-pixel SP (FIG. 2) includes an emission area EA corresponding to the micro-LED μLED and a non-emission area NEA along the periphery of the emission area EA. A switching area TrA in which the driving thin film transistor DT is arranged is defined in one side within the non-emission area NEA. More particularly, the shield metal (bottom shield metal) 104 and the driving thin film transistor DT including the source electrode 113, the drain electrode 115, the active layer including the source and drain regions 105b and 105c contacted with the source and drain electrodes 113 and 115 and made of polysilicon material, and the gate insulating layer 106 and the gate electrode 107 disposed over the active layer 105 are disposed in the switching area TrA.

The driving thin film transistor DT includes the active layer 105 including the channel region 105a with the protrusion rib 105d protruded toward the bottom shield metal 104. Since the high-temperature heat generated from the channel region 105a can be rapidly dissipated, it is possible to prevent the reliability, lifespan and driving speed of the thin film transistor DT due to the heat from being deteriorated.

In addition, since the filed effect mobility of the thin film transistor DT is increased through the cooling zone defined between the channel region 105a and the shield metal 104, the electrical properties of the thin film transistor DT are improved, which enables the thin film transistor DT to be operated at high speed, and thus, the reliability and lifespan of the thin film transistor DT are also improved.

In particular, the thin film transistor DT defines the cooling zone CZ with the protrusion rib 105d that is positioned to be more adjacent to the drain region 105c than the source region 105b in the channel region 105. The thin film transistor DT in accordance with the third embodiment of the present disclosure can improve the Kink effect, maintain a higher driving current, increase the on-current Ion, and improve its switching properties.

The switching thin film transistor ST (FIG. 2) is connected to the driving thin film transistor DT. The switching thin film transistor ST may have the same structure as the driving thin film transistor DT.

The active buffer layer 103 may be further disposed between the driving thin film transistor DT and the shield metal 104, and the multi-buffer layer 102 may be further disposed between the substrate 101 and the shield metal 104.

The source and drain electrodes 113 and 115 are disposed over the interlayer insulating layer 108 with the first and second contact holes 111a and 111b that exposes the source and drain regions 105b and 105c. In addition, the second power line VL2 (FIG. 2) arranged parallel to the data line DL (FIG. 2) may be disposed over the interlayer insulating layer 108.

A first passivation layer 117 is disposed over the source and drain electrodes 113 and 115, the second power line VL2 and the interlayer insulating layer 108 exposed between the source and drain electrodes 113 and 115. The micro-LED μLED is disposed over the first passivation layer 117 corresponding to the emission area EA.

The micro-LED μLED includes an n-type electrode 121, an emissive layer 122 and a p-type electrode 129. Holes and electrons are recombined by currents flowing between the n-type electrode 121 and the p-type electrode 129 in the emissive layer 122. The emissive layer 122 disposed between the n-type electrode 121 and the p-type electrode 129 may include a first semiconductor layer 123, an active layer 125 and a second semiconductor layer 127.

The first semiconductor layer 123 provides electrons with the active layer 125. The first semiconductor layer 123 may be made of n-GaN-based semiconductor material such as GaN, AlGaN, InGaN and/or AlInGaN, and the like. In addition, the first semiconductor layer 123 may be doped with impurity such as Si, Ge, Se, Te, C and/or the like.

The active layer 125 may be disposed on one side of the first semiconductor layer 123. The active layer 125 may have a Multi Quantum Well (MQW) structure with a well layer and a barrier layer having a bandgap higher than a bandgap of the well layer. As an example, the active layer 125 may have a MQW structure of InGaN/GaN and the like.

The second semiconductor layer 127 is disposed on the active layer 125 to provide holes to the active layer 125. The second semiconductor layer 127 may be made of p-GaN-based semiconductor material such as GaN, AlGaN, InGaN, AlInGaN and the like. In addition, the second semiconductor layer 127 may be doped with impurity such as Mg, Zn, Be and/or the like.

The p-type electrode 129 is disposed on the second semiconductor layer 127. The p-type electrode 129 may be an anode electrode providing holes with the second semiconductor layer 127. The n-type electrode 121 may be disposed on the other side of the first semiconductor layer 123 so that the n-type electrode 121 is electrically separated from the active layer 125 and the second semiconductor layer 127. The n-type electrode 121 may be a cathode electrode providing electrons with the first semiconductor layer 123.

Each of the n-type electrode 121 and the p-type electrode 129 may be made of conductive transparent material or conductive refractive material as the light emission direction from the micro-LED μLED. As an example, the conductive transparent material may include, but is not limited to, indium tin oxide (ITO) and/or indium zinc oxide (IZO). The conductive refractive material may include, but is not limited to, metal such as Au, W, Pt, Si, Ir, Ag, Cu, Ni, Ti or Cr, an alloy of the metal and combination thereof.

In one aspect, when the display device 100 is a bottom-emission type in which light emitted from the micro-LED μLED proceeds toward the substrate 101, each of the n-type electrode 121 and the p-type electrode 129 may be made of conductive refractive material. Alternatively, when the display device 100 is a top-emission type in which light emitted from the micro-LED μLED proceeds toward direction opposite to the substrate 101, each of the n-type electrode 121 and the p-type electrode 129 may be made of conductive transparent material. Hereinafter, we will describe the display device 100 having the top-emission type structure in which the n-type electrode 121 and the p-type electrode 129 are made of conductive transparent material.

As describe above, the micro-LED μLED emits light as electrons and holes are recombined by current flowing between the n-type electrode 121 and the p-type electrode 129. The micro-LED μLED may further includes a reflection pattern 133 disposed between the first semiconductor layer 123 and the first passivation layer 117. As an example, the reflection pattern 133 may be disposed between the first passivation layer 117 and the insulation pattern 131. The reflection pattern 133 reflects upwardly light emitted toward the substrate 101 among the light emitted from the micro-LED μLED so that the reflection pattern 133 can improve out-coupling efficiency of the micro-LED μLED.

Alternatively, the reflection pattern 133 may be disposed over the substrate 101. The reflection pattern 133 may be made of the same material as the gate electrode 107 of the driving thin film transistor DT and may be provided on the same layer as the gate electrode 107, but the present disclosure is not limited thereto. Alternatively, the reflection pattern 133 disposed over the substrate 101 may be made of the same material as one electrode among electrodes of the driving thin film transistor DT.

A second passivation layer 119 is disposed over the micro-LED μLED that is disposed correspondingly to the emission area EA of the sub-pixel SP. The second passivation layer 119 includes a drain contact hole PH1 exposing the drain electrode 115 of the driving thin film transistor DT together with the first passivation layer 117, and a common contact hole PH2 exposing the second power line VL2. In addition, the second passivation layer 119 includes first and second electrode contact holes 114a and 114b each of which exposes the n-type electrode 121 and the p-type electrode 129, respectively.

A first connection electrode 211 and a second connection electrode 212 are disposed on the second passivation layer 119. The first connection electrode 211 electrically connects the drain electrode 115, which is exposed through the drain contact hole PH1, of the driving thin film transistor DT to the n-type electrode 121, which is exposed through the first electrode contact hole 114a, of the micro LED μLED. The second connection electrode 212 electrically connects the second power line VL2, which is exposed through the common contact hole PH2, to the p-type electrode 129, which is exposed through the second electrode contact hole 114b, of the micro LED μLED.

Both the first and second connection electrodes 211 and 212 transmit light emitted from the active layer 125 of the micro LED μLED. As an example, the first and second connection electrodes 211 and 212 may be made of, but is not limited to, conductive transparent material such as indium tin oxide (ITO), indium zinc oxide (IZO), indium tin zinc oxide (ITZO), zinc oxide (ZnO), tin oxide (TO), and/or the like.

Accordingly, the n-type electrode 121 of the micro LED μLED is electrically connected to the drain electrode 115 of the driving thin film transistor DT through the first connection electrode 211, and the p-type electrode 129 of the micro LED μLED is electrically connected to the second power line VL2 through the second connection electrode 212 so that the micro LED μLED can emit light.

It will be apparent to those skilled in the art that various modifications and variations can be made in the present disclosure without departing from the scope of the disclosure. Thus, it is intended that the present disclosure cover the modifications and variations of the present disclosure provided they come within the scope of the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An array substrate, comprising:
    a substrate;
    a shield metal disposed over the substrate;
    a thin film transistor disposed over the shield metal;
    a first passivation layer disposed on the thin film transistor:
    a light emitting diode disposed on the first passivation layer and including a reflection pattern; and
    a second passivation layer disposed on the light emitting diode,
    wherein;
    the thin film transistor includes an active layer over the shield metal, the thin film transistor further including a source electrode, a drain electrode and a gate electrode;
    the active layer includes a channel region, a source region positioned at one side of the channel region and a drain region positioned at an opposite side of the channel region;
    at least one of the shield metal, the channel region and the array substrate includes a thermal gradient portion that causes a temperature of a first area in the channel region to be different from a temperature of a second area in the channel region; and
    a first electrode of the light emitting diode is electrically connected to the thin film transistor through a connection electrode passing through the first passivation layer and the second passivation layer.

2. The array substrate of claim 1, wherein the thermal gradient portion makes a temperature of a central area in the channel region lower than a temperature of a peripheral area in the channel region.

3. The array substrate of claim 1, wherein a width of the thermal gradient portion is narrower than a width of the channel region.

4. The array substrate of claim 1, wherein the thermal gradient portion includes a protrusion formed on one of the shield metal and the channel region, and wherein the protrusion protrudes toward the other one of the shield metal and the channel region.

5. The array substrate of claim 4, wherein the shield metal includes the protrusion directed to the channel region.

6. The array substrate of claim 5, wherein the protrusion of the shield metal is positioned closer to the drain region than the source region.

7. The array substrate of claim 4, wherein the channel region includes the protrusion directed to the shield metal.

8. The array substrate of claim 7, wherein the protrusion of the channel region is positioned closer to the drain region than the source region.

9. The array substrate of claim 1, wherein the thermal gradient portion includes a heat cover disposed on a peripheral area on the channel region.

10. An array substrate, comprising:
a plurality of thin film transistors corresponding to a plurality of sub-pixels;
a shield metal disposed under each of the plurality of thin film transistors;
a first passivation layer disposed on the plurality of thin film transistors;
a light emitting diode disposed on the first passivation layer and including a reflection pattern; and
a second passivation layer disposed on the light emitting diode,
wherein each of the plurality of thin film transistors includes:
an active layer including a channel region, a source region positioned at one side of the channel region and a drain region positioned at an opposite side of the channel region;
a gate insulating layer covering the channel region;
a gate electrode on the gate insulating layer;
an interlayer insulating layer covering the active layer, the gate insulating layer and the gate electrode;
a source electrode disposed on the interlayer insulating layer and connected to the source region; and
a drain electrode disposed on the interlayer insulating layer and connected to the drain region, and
wherein:
at least one of the shield metal, the channel region and the array substrate includes a thermal gradient portion that causes a temperature of a first area in the channel region to be different from a temperature of a second area in the channel region; and
a first electrode of the light emitting diode is electrically connected to the thin film transistor through a connection electrode passing through the first passivation layer and the second passivation layer.

11. The array substrate of claim 10, wherein the thermal gradient portion causes a temperature of a central area in the channel region to be lower than a temperature of a peripheral area in the channel region.

12. The array substrate of claim 10, wherein a width of the thermal gradient portion is narrower than a width of the channel region.

13. The array substrate of claim 10, wherein the thermal gradient portion includes a protrusion on one of the shield metal and the channel region, and wherein the protrusion protrudes toward the other one of the shield metal and the channel region.

14. The array substrate of claim 13, wherein the shield metal includes the protrusion directed toward the channel region.

15. The array substrate of claim 14, wherein the protrusion of the shield metal is positioned closer to the drain region than the source region.

16. The array substrate of claim 13, wherein the channel region includes the protrusion directed toward the shield metal.

17. The array substrate of claim 16, wherein the protrusion of the channel region is positioned closer to the drain region than the source region.

18. The array substrate of claim 10, wherein the thermal gradient portion includes a heat cover disposed on a peripheral area on the channel region.

19. A display device, comprising an array substrate including:
a substrate;
a shield metal disposed over the substrate;
a thin film transistor disposed over the shield metal;
a first passivation layer disposed on the thin film transistor;
a light emitting diode disposed on the first passivation layer and including a reflection pattern; and
a second passivation layer disposed on the light emitting diode,
wherein;
the thin film transistor includes an active layer over the shield metal, a source electrode, a drain electrode and a gate electrode;
the active layer includes a channel region, a source region positioned at one side of the channel region and a drain region positioned at an opposite side of the channel region;
the shield metal or the channel region is provided with a thermal gradient portion that causes a temperature of a first area in the channel region to be different from a temperature of a second area in the channel region;
an electro-luminescence element electrically connected to the thin film transistor of the array substrate; and
a first electrode of the light emitting diode is electrically connected to the thin film transistor through a connection electrode passing through the first passivation layer and the second passivation layer.

20. The display device of claim 19, wherein the shield metal is provided with a protrusion directed toward the channel region as the thermal gradient portion.

21. The display device of claim 19, wherein the channel region is provided with a protrusion directed to the shield metal as the thermal gradient portion.

22. The display device of claim 19, wherein the channel region is provided with a heat cover on a peripheral area on the channel region as the thermal gradient portion.

23. The display device of claim 19, wherein the first area is an area corresponding to the thermal gradient portion in the channel region, and the second area is an area in the channel region other than the first area.

* * * * *

UNITED STATES PATENT AND TRADEMARK OFFICE
CERTIFICATE OF CORRECTION

PATENT NO. : 12,471,313 B2
APPLICATION NO. : 17/977978
DATED : November 11, 2025
INVENTOR(S) : Deuk-Ho Yeon et al.

Page 1 of 1

It is certified that error appears in the above-identified patent and that said Letters Patent is hereby corrected as shown below:

In the Claims

Column 20, Claim 1, Line 44:
"wherein;" should read: --wherein:--.

Column 22, Claim 19, Line 31:
"wherein;" should read: --wherein:--.

Column 22, Claim 19, Line 48:
"laver." should read: --layer.--.

Signed and Sealed this
Third Day of February, 2026

John A. Squires
*Director of the United States Patent and Trademark Office*